US006940350B2

(12) United States Patent
Youn et al.

(10) Patent No.: US 6,940,350 B2
(45) Date of Patent: Sep. 6, 2005

(54) AMPLIFIER AND METHOD FOR CANCELING NONLINEARITY IN AMPLIFIER

(75) Inventors: Yong-Sik Youn, Daejeon (KR); Hyun-Kyu Yu, Daejeon (KR); Mun-Yang Park, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/618,507

(22) Filed: Jul. 11, 2003

(65) Prior Publication Data

US 2004/0119538 A1 Jun. 24, 2004

(30) Foreign Application Priority Data

Dec. 24, 2002 (KR) ................................. 10-2002-0083716
Feb. 6, 2003 (KR) ................................. 10-2003-0007513

(51) Int. Cl.[7] ................................................ H03F 1/22
(52) U.S. Cl. ...................... 330/149; 330/295; 330/311
(58) Field of Search ............................... 330/149, 277, 330/295, 296, 311; 327/307

(56) References Cited

U.S. PATENT DOCUMENTS

| 6,204,728 | B1 | | 3/2001 | Hageraats |
| 6,392,492 | B1 | | 5/2002 | Yuan |
| 6,489,827 | B1 | * | 12/2002 | Sutardja ..................... 327/307 |
| 6,710,662 | B2 | * | 3/2004 | Wang ......................... 330/295 |

* cited by examiner

Primary Examiner—Steven J. Mottola
(74) Attorney, Agent, or Firm—Blakely Sokoloff Taylor & Zafman

(57) ABSTRACT

An amplifier including an amplifier transistor that operates in an active region has main current flowing therethrough according to input voltage, and a linear transistor that is driven by offset positive-polarity input voltage to operate in a linear region and has auxiliary current flowing therethrough. The main current and auxiliary current are added to become output current. The offset positive-polarity voltage corresponds to the sum of AC component of the input voltage and an offset DC voltage. Here, a transistor stacked on the linear transistor is coupled to the amplifier transistor to secure the linear region operation of the linear transistor. The stacked transistor is driven by a voltage having polarity opposite to that of the input voltage.

18 Claims, 9 Drawing Sheets

PRIOR ART

AMPLIFIER AND METHOD FOR CANCELING NONLINEARITY IN AMPLIFIER

CROSS REFERENCE TO RELATED APPLICATION

This application is based on Korea Patent Applications No. 2002-83716 filed on Dec. 24, 2002 and No. 2003-7513 filed on Feb. 6, 2003 in the Korean Intellectual Property Office, the content of which is incorporated herein by reference.

BACKGROUND OF THE INVENTION (a) Field of the Invention

The present invention generally relates to an amplifier, and more particularly, to a method for canceling third order nonlinearity components in an amplifier.

(b) Description of the Related Art

One of the important matters that should be considered in designing analog integrated circuits using semiconductors is to output incoming signals without distorting them, which is called linearity of a circuit. Though an ideal amplifier satisfies a linear function relationship between an output signal y and an input signal x as represented by equation (1), Tayler series are developed as equation (2) in an actual circuit.

$$y = gx \quad (1)$$

$$y = g_1 x + g_2 x^2 + g_3 x^3 \quad (2)$$

where terms of more than second order, $g_2 x^2$ and $g_3 x^3$, represent nonlinear distortion in the actual circuit.

FIG. 1A shows a conventional common source amplifier that is composed of an amplifier transistor M1 and a load. FIG. 1B is a graph showing the relationship between input voltage $V_{in}$ applied to the gate of the transistor M1 of FIG. 1A and output current $I_{out}$. In FIG. 1B, curves G1, G2, and G3 represent factors $g_1$, $g_2$, and $g_3$ of equation (2) in DC, respectively. The available biasing range of an amplifier is determined from an appropriate relationship between consumption power and amplification gain. That is, high output current $I_{out}$ increases consumption power in the range where the input voltage $V_{in}$ is too high, and small first order linearity component G1 decreases gain amplification in the range where the input voltage $V_{in}$ is too low. Thus, the available bias is determined at the point where the input voltage $V_{in}$ is about 0.7V (±0.2V) according to trade-off of the output current $I_{out}$ and first order linearity component G1 as shown in FIG. 1B.

Where the input voltage $V_{in}$ is about 0.7V as shown in FIG. 1B, however, third order nonlinearity component G3 has a maximum magnitude in the active region, and second order nonlinearity component G2 also has relatively large magnitude. The second order nonlinearity hardly generates in general analog integrated circuits, since most of them operate based on differential signal processing. In addition, the second order nonlinearity is an insignificant problem in modulation and demodulation in the current radio communication system. However, third order nonlinearity is a significant matter because it generates signal distortion in a transmission/reception band due to intermodulation of neighboring channel signals.

A conventional technique for canceling the third order nonlinearity to improve linearity of a circuit is to increase DC current. However, this technique is not suitable for portable devices that require low power consumption because a high DC current increases power consumption. To solve this problem, a method for canceling nonlinearity using an additional circuit without supplying high DC current has been proposed. However, a general additional circuit has a complicated structure so that the overall area of the amplifier becomes larger, or consumption power increases. Accordingly, a method employing a simple additional circuit is required.

SUMMARY OF THE INVENTION

An advantage of the present invention is to provide an amplifier with small power consumption and a simple structure, and which is capable of canceling third order nonlinearity without having a loss of amplification gain.

The present invention uses a transistor operating in a linear region in order to accomplish the advantage.

An amplifier according to the present invention includes a first transistor that operates in an active region and has a first current flowing therethrough, and a second transistor that is driven by a first voltage and has a second current flowing therethrough. The amplifier further includes a third transistor that is driven by a second voltage to guarantee a linear region operation of the second transistor and is stacked on the second transistor to be coupled to the output terminal of the first transistor. The output current of the third transistor includes first and second currents.

Preferably, the first voltage corresponds to the sum of an offset DC voltage and an AC component bypassed input voltage.

According to an embodiment of the invention, the second voltage corresponds to the sum of an offset DC voltage and an AC component bypassed third voltage having polarity opposite to that of the input voltage.

According to an embodiment of the invention, the second voltage corresponds to the sum of an offset DC voltage and an AC component bypassed voltage at the output terminal of the first transistor.

According to an embodiment of the invention, the second voltage corresponds to voltage at the output terminal of the first transistor.

An amplifier according to another aspect of the present invention includes a first transistor driven by input voltage, a second transistor driven by a first voltage and being coupled to a first terminal of the first transistor, and a third transistor stacked on the second transistor, driven by a second voltage and coupled to a second terminal of the first transistor. The first transistor operates in an active region, and the second transistor operates in a linear region according to the second voltage and the third transistor.

The present invention further provides a method for canceling nonlinearity in an amplifier. The amplifier includes a first transistor operating in an active region according to input voltage and a second transistor driven by a first voltage. Here, a second voltage is applied to a third transistor stacked on the second transistor to allow the second transistor to operate in a linear region. A first current flowing through the first transistor and a second current flowing through the second transistor are added to become output current.

BRIEF DESCRIPTION OF THE DRAWINGS

Further objects and advantages of the invention can be more fully understood from the following detailed description taken in conjunction with the accompanying drawings, in which.

DETAILED DESCRIPTION OF THE PREFERRED EMBODIMENT

The present invention will now be described in connection with preferred embodiments with reference to the accompanying drawings. First, an amplifier according to a first embodiment of the present invention is explained in detail with reference to FIGS. 2A and 2B.

Figure 1A:
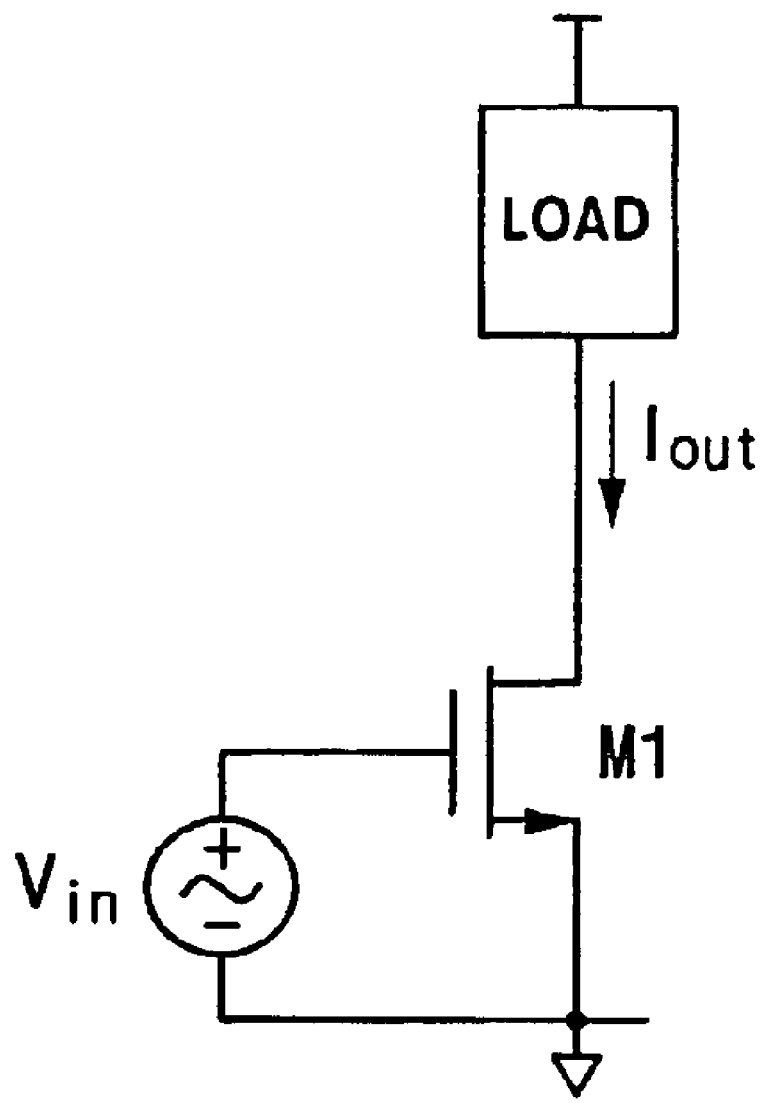
FIG. 1A is a circuit diagram of a conventional amplifier.
Figure 1B:
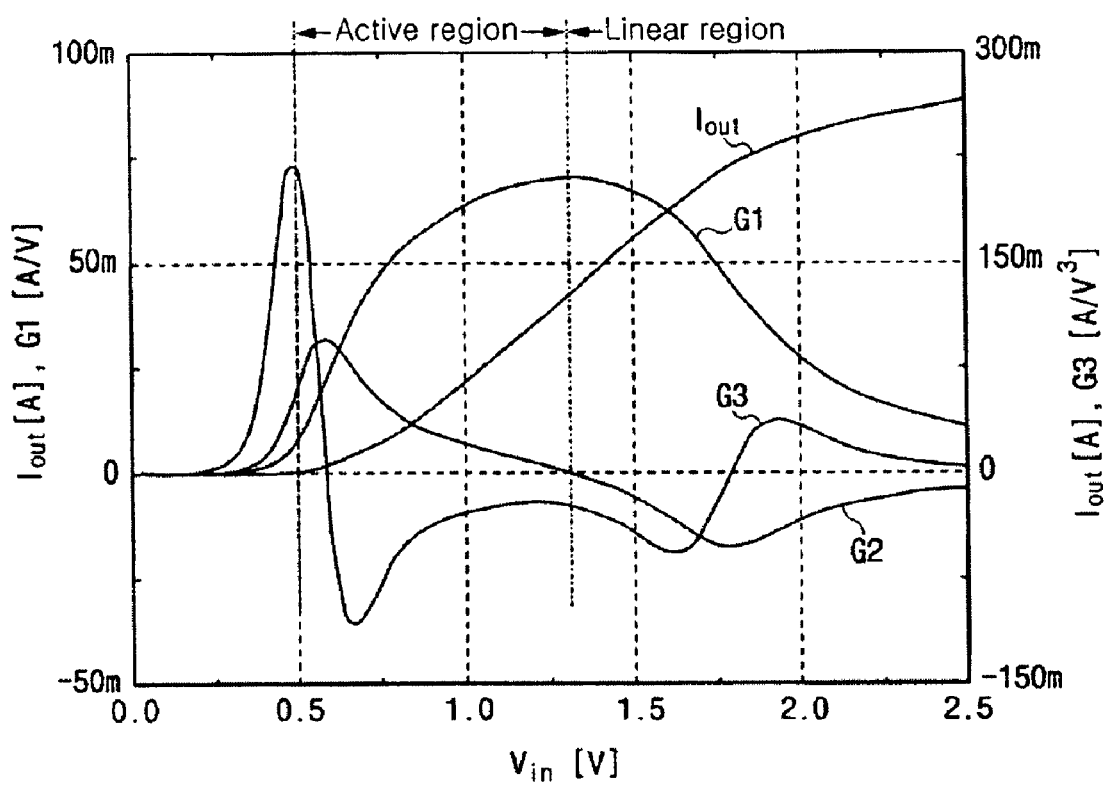
FIG. 1B is a graph showing the relationship between input voltage and output current of the amplifier of FIG. 1A.
Figure 2A:
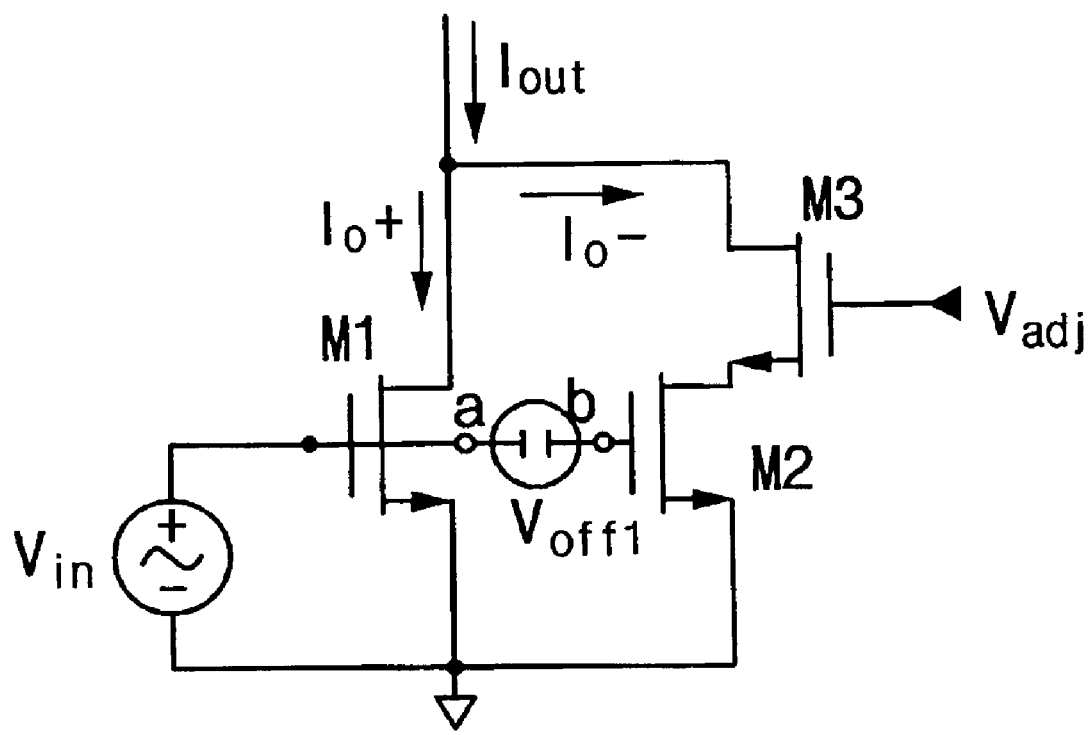
FIG. 2A is a circuit diagram of an amplifier according to a first embodiment of the present invention.
Figure 2B:
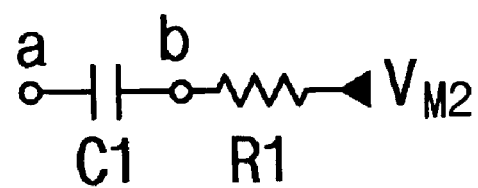
FIG. 2B is a circuit of the offset DC voltage source of the amplifier of FIG. 2A.

As shown in FIG. 2A, the amplifier according to the first embodiment of the invention includes three transistors M1, M2, and M3 and an offset DC voltage source $V_{off1}$. In the first embodiment, third order nonlinearity component G3 in a linear region is superposed in order to cancel the third order nonlinearity component G3 in the region where the input voltage $V_{in}$ is 0.7V(±0.2V) in the graph of FIG. 1B. For this, the transistors M2 and M3 are added to the amplifier of FIG. 1A.

The input voltage $V_{in}$ is applied to the gate of the amplifier transistor M1. Current flowing through the drain of the transistor M1 becomes major output current $1_{o+}$. The linear transistor M2 and the transistor M3 stacked thereon are coupled in parallel with the transistor M1. The offset DC voltage source $V_{off1}$ is coupled between the input voltage $V_{in}$ and the gate of the transistor M2. An offset DC voltage $V_{off1}$ performs AC coupling and determines DC voltage of the gate of the transistor M2. The offset DC voltage source $V_{off1}$ can be replaced by an equivalent circuit constructed in a manner such that a capacitor C1 is serially coupled with a resistor R1 having a DC voltage source $V_{M2}$. Adjustment voltage $V_{adj}$ for securing a linear region operation of the transistor M2 is applied to the gate of the transistor M3.

According to the aforementioned configuration, the output current $I_{out}$ becomes the sum of the current $1_{o+}$ flowing into the transistor M1 and the current $1_{o-}$ flowing to the transistors M2 and M3. Thus, the transistor M2 operates in the linear region according to the transistor M3 and offset DC voltage source $V_{off1}$. As shown in FIG. 1B, consequently, third order nonlinearity component G3 of the current $1_{o+}$ of the transistor M1 that operates in the active region is combined with third order nonlinearity component G3 of the current $1_{o-}$ of the transistor M2 operating in the linear region, which has a polarity opposite to that of the current $1_{o+}$, so that third order nonlinearity component G3 in the output current Iout corresponding to the sum of the two current components $1_{o+}$ and $1_{o-}$ can be cancelled.

According to experimental results, the maximum value of third order nonlinearity component G3 of a transistor operating in the linear region has a nearly uniform tendency irrespective of DC current. Accordingly, the third order nonlinearity component G3 of the transistor M1 operating in the active region can be cancelled only with a relatively small current of the transistor M2 operating in the linear region. Since the maximum value of the third order nonlinearity component G3 in the linear region is merely half that of the third order nonlinearity component G3 in the active region, as shown in FIG. 1B, it is preferable that the size of the transistor M2 operating in the linear region is about twice that of the transistor M1 operating in the active region.

Here, because the linear transistor M2 has a size twice that of the transistor M1 while having low amplification gain, a degree of increase in parasite capacitance $C_{gs}$ is larger than a degree of increase in conductance gm according to the transistor M2 in the amplifier. Accordingly, the cutoff frequency of the amplifier, represented by following equation (3), can be equivalently reduced.

$$\omega_T = \frac{g_m}{G_{gs}} \quad (3)$$

Figure 3A:
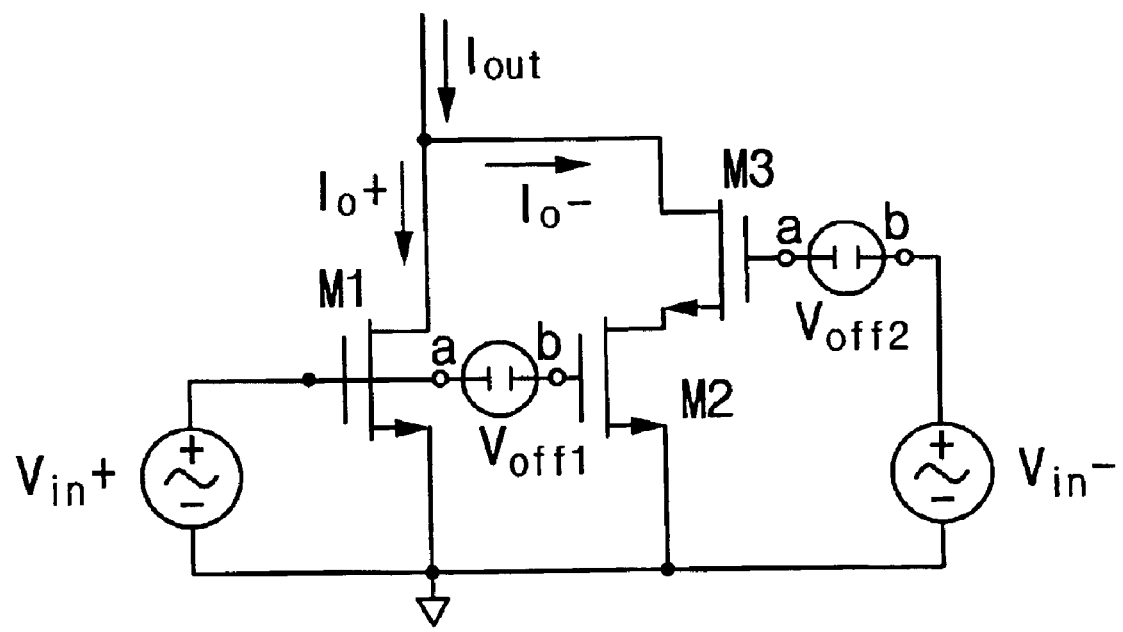
FIG. 3A is a circuit diagram of an amplifier according to a second embodiment of the present invention.
Figure 3B:
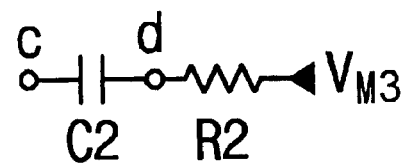
FIG. 3B is a circuit diagram of the offset DC voltage source of the amplifier of FIG. 3A.
Figure 4:
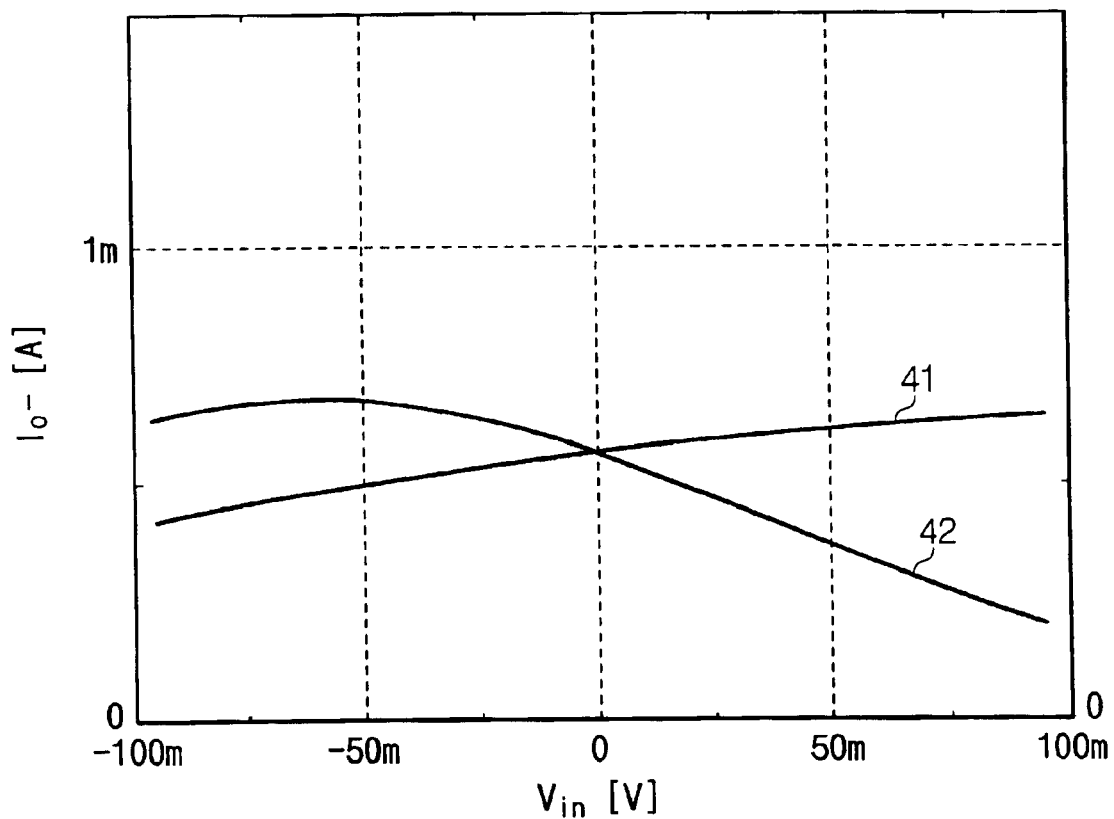
FIG. 4 is a graph illustrating current flowing through linear transistors in the amplifiers according to the first and second embodiments of the present invention.
Figure 5A:
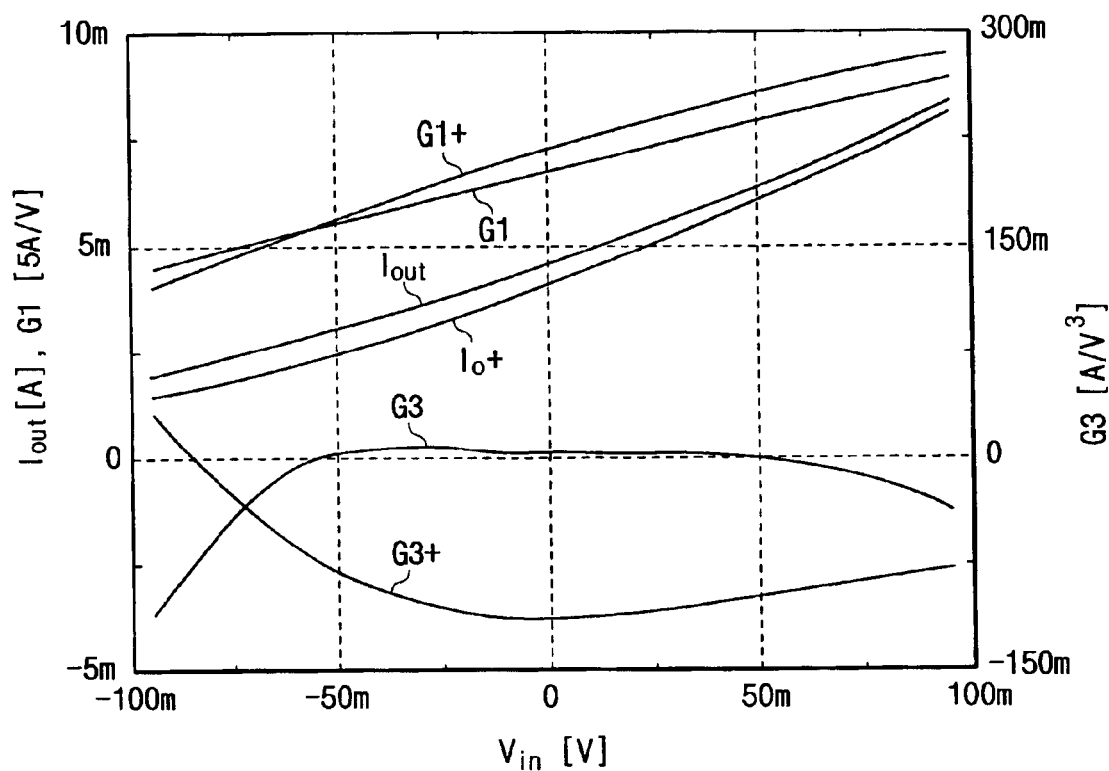
FIGS. 5A and 5B are graphs illustrating third order nonlinearity in the case that the amplifier according to the second embodiment of the invention operates with DC and AC, respectively.
Figure 5B:
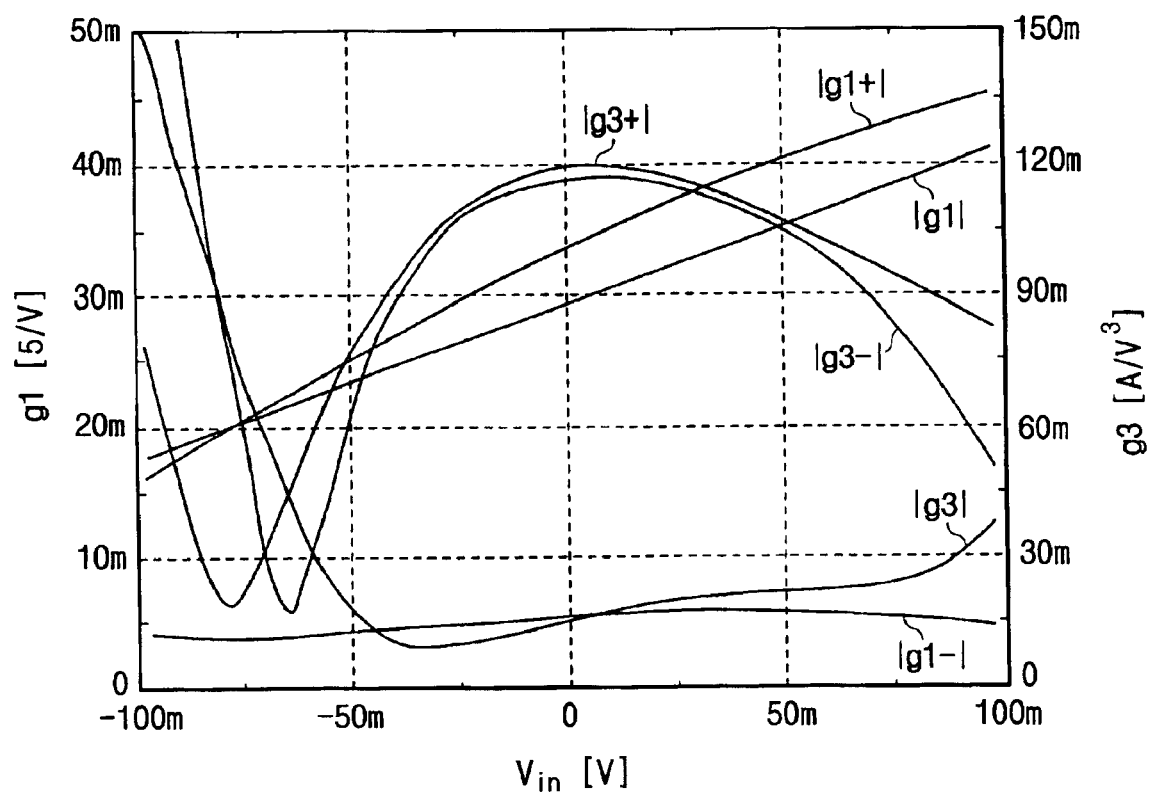
Figure 6:
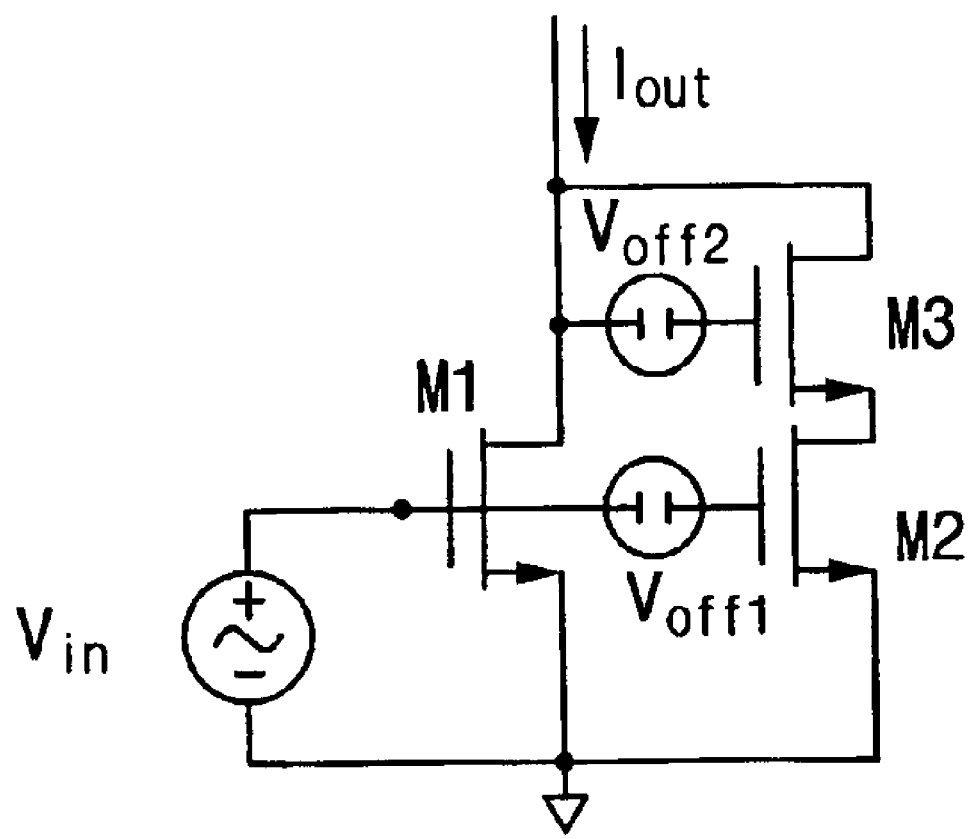
FIG. 6 is a circuit diagram of a single signal amplifier according to a third embodiment of the present invention.
Figure 7:
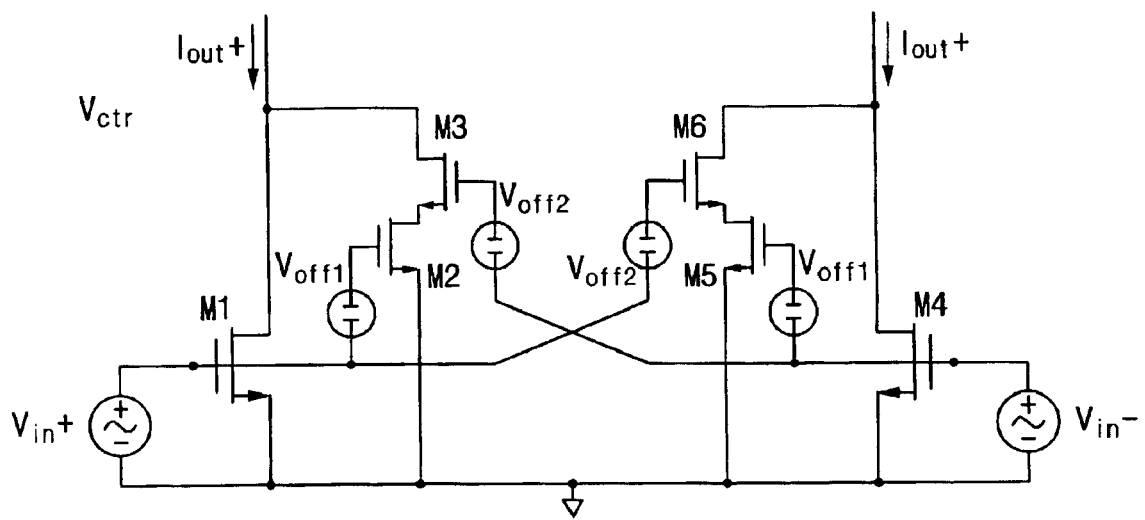
FIG. 7 is a circuit diagram of an amplifier operating according to a differential signal according to a fourth embodiment of the present invention.

An embodiment for mitigating the reduction in the cutoff frequency is described below with reference to FIGS. 3A to 5B. FIG. 3A is a circuit diagram of an amplifier according to a second embodiment of the present invention, and FIG. 3B is a circuit diagram of the offset DC voltage source of the amplifier of FIG. 3A. FIG. 4 is a graph illustrating current flowing through linear transistors in the amplifiers according to the first and second embodiments of the present invention. FIGS. 5A and 5B are graphs illustrating third order nonlinearity in the case that the amplifier according to the second embodiment of the invention operates with DC and AC, respectively. FIG. 6 is a circuit diagram of a single signal amplifier according to a third embodiment of the present invention, and FIG. 7 is a circuit diagram of an amplifier operating according to a differential signal according to a fourth embodiment of the present invention.

As shown in FIG. 3A, the amplifier according to the second embodiment of the invention is distinguished from the amplifier of the first embodiment in that the linear transistor M2 and the stack transistor M3 are operated with two signals having polarities opposite to each other. Specifically, input voltage $V_{in+}$ with positive polarity is applied to the gate of the transistor M1 while the input voltage $V_{in+}$ having negative polarity is applied to the gate of the transistor M3 through the offset DC voltage source $V_{off1}$. The input voltage $V_{in+}$ is identical to the input voltage $V_{in}$ in the first embodiment. In addition, input voltage $V_{in-}$ with negative polarity is applied to the gate of the transistor M3 through the offset DC voltage source $V_{off2}$. Similarly to the offset DC voltage source $V_{off1}$, the offset DC voltage source $V_{off2}$ can be replaced with an equivalent circuit constructed in a manner such that a capacitor C2 is serially coupled with a resistor R2 having a DC voltage source $V_{M3}$, as shown in FIG. 3B. According to the aforementioned circuit configuration, it is possible to obtain the result that the gate and drain of the transistor M2 are driven with the input voltage $V_{in+}$ and $V_{in-}$ having positive polarity and negative polarity, respectively.

While the transistor M2 operates in the linear region, the current $1_{o-}$ flowing through the transistor M2 largely depends on the voltage $V_{in-}$ applied to the drain of the transistor M2 rather than the voltage $V_{in+}$ applied to the gate of the transistor M2 when the transistor M2 operates in a deeper linear region. As shown in FIG. 4, accordingly, the current 41 ($1_{o-}$ of FIG. 2) in the first embodiment increases with the input voltage $V_{in}$ applied to the gate of the transistor M2, whereas the current 42 ($1_{o-}$ of FIG. 3) in the second embodiment decreases with the input voltage $V_{in}$. Thus, the overall transconductance $g_m$ is decreased. Since the trace of the current 42 ($1_{o-}$ of FIG. 3) is abruptly changed, the third order nonlinearity component G3 has a value of more than several times that of the first embodiment.

In the second embodiment, accordingly, the transistor M2 having a size considerably smaller than that of the first embodiment can be employed in order to cancel the third order nonlinearity component G3+ of the current $1_{o+}$ flowing through the transistor M1 operating in the active region. As represented by the equation (3), the reduction in the cutoff frequency can be mitigated as the size of the transistor M2 decreases. Thus, deterioration in the performance of the circuit can be minimized while obtaining high linearity.

FIG. 5A shows experimental results when the voltage applied to the amplifier of the second embodiment is DC voltage. Referring to FIG. 5A, the third order nonlinearity component G3 in the entire amplifier is close to zero while the third order nonlinearity component G3+ of the transistor M1 operating in the active region has a value ranging from 0 to -120 mA/V$^3$. The cancellation of the third order nonlinearity component G3 can be confirmed from the fact that first order linearity component G1 of the output current $1_{out}$ has a curve closer to a straight line than first order linearity component G1+ of the current $1_{o+}$ of the transistor M1.

FIG. 5B shows experimental results obtained when AC voltage of 2.5GHz is applied to the amplifier according to the second embodiment. Referring to FIG. 5B, while the magnitude |g3+| of the third order nonlinearity component of the transistor M1 operating in the active region has a value ranging from 0 to 120 mA/V$^3$, it can be known that the magnitude |g3-| of the third order nonlinearity component of the transistor M2 operating in the linear region also has a similar value. Accordingly, the magnitude |g3| of the third order nonlinearity component in the amplifier has a value close to zero at the input voltage $V_{in}$ in the range from -60 mV to 60 mV.

Next, amplifiers according to third and fourth embodiments of the invention are explained with reference to FIGS. 6 and 7. FIG. 6 is a circuit diagram of the amplifier according to the third embodiment of the present invention, and FIG. 7 is a circuit diagram of the amplifier operating according to the fourth embodiment of the present invention.

Referring to FIG. 6, the amplifier according to the third embodiment of the invention has a structure similar to that of the amplifier according to the second embodiment excepting that the drain of the amplifier transistor M1 is coupled to the gate of the transistor M3 through the offset DC voltage source $V_{off2}$. That is, the same effect as that of the second embodiment is obtained only with input voltage $V_{in}$ of a single signal by using the drain voltage of the transistor M1 as input voltage $V_{in-}$ having negative polarity.

Referring to FIG. 7, the amplifier according to the fourth embodiment of the invention is constructed in a manner such that two amplifiers according to the second embodiment are coupled to each other and operated according to differential signals $V_{in+}$ and $V_{in-}$. In other words, the amplifier according to the second embodiment is coupled in parallel with an amplifier having input voltage $V_{in-}$ with negative polarity as input voltage. The amplifier coupled in parallel with the amplifier according to the second embodiment is composed of three transistors M4, M5, and M6, as shown in FIG. 7, and the input voltage $V_{in-}$ with negative polarity is applied to the gate of the transistor M4 as input voltage. Furthermore, positive-polarity input voltage $V_{in+}$ is applied to the gate of the stack transistor M6 through an offset DC voltage source $V_{off2}$ in order to secure the linear region operation of the linear transistor M5. Consequently, a differential signal amplifier whose input voltages $V_{in+}$ and $V_{in-}$ and output currents $1_{out+}$ and $1_{out-}$ have both positive polarity and negative polarities, is used.

While the drain of the stack transistor M3 is coupled to the drain of the amplifier transistor M1 in the embodiments of the invention, it can be coupled to any point coupled to the output current $1_{o+}$ of the amplifier transistor M1 according to a load construction method. Furthermore, although it has been described above that the offset DC voltage sources $V_{off1}$ and $V_{off2}$ provide specific DC voltages in the aforementioned embodiments of the present invention, it is not limited thereto because the offset DC voltage sources $V_{off1}$ and $V_{off2}$ can perform AC coupling even if they are short-circuited. In addition, while the transistors M1 to M6 are MOSFETs in the above-described embodiments, the transistors are not limited thereto and they can employ other transistors irrespective of a transistor fabrication process. Moreover, a resistor or an inductor can be added to a point between the common source of the transistors M1 and M2 and the ground terminal in order to improve performance of the amplifiers.

Although specific embodiments including the preferred embodiment have been illustrated and described, it will be obvious to those skilled in the art that various modifications may be made without departing from the spirit and scope of the present invention, which is intended to be limited solely by the appended claims.

According to the present invention, a third order nonlinearity component that may generate signal distortion in an amplifier can be cancelled. Furthermore, a circuit for canceling the third order nonlinearity component can be constructed in a simple structure so as to minimize deterioration in the performance of the amplifier, such as with consumption power and amplification gain, and restrain an increase in the semiconductor area.

What is claimed is:

1. An amplifier comprising:
    a first transistor driven by input voltage;
    a second transistor driven by a first voltage, the second transistor being coupled to a first terminal of the first transistor; and
    a third transistor stacked on the second transistor and driven by a second voltage, the third transistor being coupled to a second terminal of the first transistor,
    wherein the first transistor operates in an active region, and the second transistor operates in a linear region according to the second voltage and the third transistor, and the second voltage is applied when a third voltage having polarity opposite to that of the input voltage passes through an offset DC voltage source that performs AC coupling and determines DC voltage.

2. The amplifier as claimed in claim 1, wherein the first voltage is applied when the input voltage passes through an offset DC voltage source that performs AC coupling and determines DC voltage.

3. The amplifier as claimed in claim 1, wherein the second voltage is applied when a voltage applied to a contact node of the first transistor and the third transistor passes through an offset DC voltage source that performs AC coupling and determines DC voltage.

4. The amplifier as claimed in claim 2, wherein both ends of the offset DC voltage source perform AC coupling when they are both short-circuited.

5. The amplifier as claimed in one of claims 2, wherein the offset DC voltage source includes a capacitor coupled between both ends thereof and a resistor coupled between a DC voltage source and one end thereof.

6. An amplifier that outputs amplified output current according to input voltage, comprising:

a first transistor operating in an active region, a first current flowing through the first transistor according to the input voltage;

a second transistor driven by a first voltage, a second current flowing through the second transistor; and a third transistor driven by a second voltage to secure a linear region operation of the second transistor, the third transistor being stacked on the second transistor to be coupled to the output terminal of the first transistor, wherein the output current includes the first and second currents, and the second voltage corresponds to the sum of an offset DC voltage and an AC component bypassed third voltage having polarity opposite to that of the input voltage.

7. The amplifier as claimed in claim 6, wherein the first voltage corresponds to the sum of an offset DC voltage and an AC component bypassed input voltage.

8. The amplifier as claimed in claim 6, wherein the second voltage corresponds to the sum of an offset DC voltage and AC component bypassed voltage of the output terminal of the first transistor.

9. The amplifier as claimed in claim 6, wherein the second voltage corresponds to voltage at the output terminal of the first transistor.

10. A method for canceling nonlinearity in an amplifier having a first transistor operating in an active region according to input voltage and a second transistor driven by a first voltage, the method comprising:

applying a second voltage to a third transistor stacked on the second transistor to allow the second transistor to operate in a linear region; and adding a first current flowing through the first transistor and a second current flowing through the second transistor, and applying the second voltage when a third voltage having polarity opposite to that of the input voltage passes through an offset DC voltage source that performs AC coupling and determines DC voltage.

11. The method as claimed in claim 10, wherein the first voltage corresponds to the sum of an offset DC voltage and AC component bypassed input voltage.

12. An amplifier comprising:

a first transistor driven by input voltage;

a second transistor driven by a first voltage, the second transistor being coupled to a first terminal of the first transistor; and a third transistor stacked on the second transistor and driven by a second voltage, the third transistor being coupled to a second terminal of the first transistor, wherein the first transistor operates in an active region, and the second transistor operates in a linear region according to the second voltage and the third transistor, and the second voltage is applied when a voltage applied to a contad node of the first transistor and the third transistor passes through an offset DC voltage source that performs AC coupling and determines DC voltage.

13. The amplifier as claimed in claim 12, wherein the first voltage is applied when the input voltage passes through an offset DC voltage source that performs AC coupling and determines DC voltage.

14. The amplifier as claimed in claim 12, wherein the second voltage is applied when a third voltage having polarity opposite to that of the input voltage passes through an offset DC voltage source that performs AC coupling and determines DC voltage.

15. The amplifier as claimed in claim 13, wherein both ends of the offset DC voltage source perform AC coupling when they are both short-circuited.

16. The amplifier as claimed in one of claims 13, wherein the offset DC voltage source includes a capacitor coupled between both ends thereof and a resistor coupled between a DC voltage source and one end thereof.

17. An amplifier that outputs amplified output current according to input voltage, comprising:

a first transistor operating in an active region, a first current flowing through the first transistor according to the input voltage;

a second transistor driven by a first voltage, a second current flowing through the second transistor; and a third transistor driven by a second voltage to secure a linear region operation of the second transistor, the third transistor being stacked on the second transistor to be coupled to the output terminal of the first transistor, wherein the output current includes the first and second currents, and the second voltage corresponds to the sum of an offset DC voltage and AC component bypassed voltage of the output terminal of the first transistor.

18. An amplifier that outputs amplified output current according to input voltage, comprising:

a first transistor operating in an active region, a first current flowing through the first transistor according to the input voltage;

a second transistor driven by a first voltage, a second current flowing through the second transistor; and a third transistor driven by a second voltage to secure a linear region operation of the second transistor, the third transistor being stacked on the second transistor to be coupled to the output terminal of the first transistor, wherein the output current includes the first and second currents, and the second voltage corresponds to voltage at the output terminal of the first transistor.

* * * * *